(12) United States Patent
Montojo et al.

(10) Patent No.: US 7,995,684 B2
(45) Date of Patent: Aug. 9, 2011

(54) METHOD AND APPARATUS FOR AUTOMATIC GAIN CONTROL OF A MULTI-CARRIER SIGNAL IN A COMMUNICATION RECEIVER

(75) Inventors: Juan Montojo, San Diego, CA (US); Rohan Sudhakar Salvi, San Diego, CA (US); Peter J. Black, San Diego, CA (US)

(73) Assignee: QUALCOMM, Incorporated, San Diego, CA (US)

( * ) Notice: Subject to any disclaimer, the term of this patent is extended or adjusted under 35 U.S.C. 154(b) by 1056 days.

(21) Appl. No.: 10/437,203

(22) Filed: May 12, 2003

(65) Prior Publication Data

US 2004/0151264 A1 Aug. 5, 2004

Related U.S. Application Data

(60) Provisional application No. 60/444,283, filed on Feb. 1, 2003.

(51) Int. Cl.
*H04L 27/08* (2006.01)

(52) U.S. Cl. ........ 375/345; 375/219; 375/148; 375/130; 455/234.1; 455/240.1; 455/242.2

(58) Field of Classification Search .................. 375/345, 375/219, 130, 148; 370/336, 342, 345; 455/240, 455/234.1, 240.1, 242.2; 341/143, 144, 120
See application file for complete search history.

(56) References Cited

U.S. PATENT DOCUMENTS

| | | | | |
|---|---|---|---|---|
| 5,175,883 A | * | 12/1992 | Ueno | 455/242.2 |
| 5,852,630 A | * | 12/1998 | Langberg et al. | 375/219 |
| 6,480,528 B1 | | 11/2002 | Patel et al. | |
| 6,504,863 B1 | * | 1/2003 | Hellmark | 375/219 |
| 6,570,864 B1 | * | 5/2003 | Kim et al. | 370/342 |
| 6,642,871 B2 | * | 11/2003 | Takeyabu et al. | 341/120 |
| 6,799,024 B2 | * | 9/2004 | Wang et al. | 455/234.1 |
| 7,035,610 B2 | * | 4/2006 | Tsushima | 455/240.1 |
| 2002/0054583 A1 | * | 5/2002 | Olesen et al. | 370/336 |
| 2007/0085718 A1 | * | 4/2007 | Axness et al. | 341/143 |

FOREIGN PATENT DOCUMENTS

| JP | 04341027 | 11/1992 |
|---|---|---|
| JP | 2001127735 | 5/2001 |

OTHER PUBLICATIONS

International Search Report and Written Opinion—PCT/US2004/002927, International Search Authority—European Patent Office—Jul. 22, 2004.

* cited by examiner

*Primary Examiner* — Eva Y Puente
(74) *Attorney, Agent, or Firm* — Sayed Hossain Beladi; William M. Hooks (57) ABSTRACT

A receiver operates to AGC a multi-carrier signal through a corresponding number of inner loops and an outer loop AGC processes. A first number of bits for representing the multi-carrier signal with a limited amount of interference is determined through a calibration mode process. The first number of bits provides for quantization of the multi-carrier signal at an outer loop AGC to a maximum quantization level. After the received signal power estimate is reached a predetermined "ON" threshold, the outer loop AGC is operated at a second number of bits higher than the first number of bits to allow a quantization of possible interference in accordance with a difference of the first and second number of bits. The outer loop AGC switches back to use the first number of bits when the received signal power estimate falls below a predetermined "OFF" threshold.

5 Claims, 3 Drawing Sheets

METHOD AND APPARATUS FOR AUTOMATIC GAIN CONTROL OF A MULTI-CARRIER SIGNAL IN A COMMUNICATION RECEIVER

CROSS-REFERENCE

This present application claims priority from U.S. provisional application Ser. No. 60/444,283, filed on Feb. 1, 2003, entitled "Improving Demodulation Performance at Low Geometries With Few Adjacent Cells".

FIELD

The present invention relates generally to the field of communications, and more particularly, to automatic gain control of a multi-carrier signal in a communication receiver.

BACKGROUND

Generally, various forms of automatic gain control (AGC) of a signal are known. The AGC process for a received signal may allow for limiting the distortion level of the received signal before a demodulation process of the received signal. The AGC operation normally includes comparing the signal strength of a received signal to a threshold. Depending on the signal strength level with respect to the threshold level, an amplifier amplifying the received signal for a receiver processing may change the amplification level. In another aspect, the amplification process may change to attenuation of the received signal based on the received signal strength level. For proper demodulation of the signal, the receiver normally may have a filter in the signal path that filters to some degree the signals outside the frequency range of the signal carrying the received data. As a result, the received signal strength level is mainly an indication of the signal strength of the in-band signal. After the AGC processing of the signal, the signal is passed on to a demodulator for extracting the received information.

However, for receive processing of a multi-carrier signal, the front-end filter has a wide frequency bandwidth allowing for the entire band of the multi-carriers. One ordinary skilled in the art may appreciate that the demodulation process for a multi-carrier signal includes a different demodulation process for each carrier in the multi-carrier signal. As such, each carrier of the multi-carrier signal may need an independent AGC process. With a wideband filter for a multi-carrier signal, the received signal strength in the AGC process is an indication of the signal strength of all carriers in the multi-carrier signal. Therefore, there is a need for a method and apparatus for front end AGC processing of a multi-carrier signal and independent AGC process and demodulation of each carrier signal in a communication receiver.

BRIEF DESCRIPTION OF THE DRAWINGS

The features, objects, and advantages of the present invention will become more apparent from the detailed description set forth below when taken in conjunction with the drawings in which like reference characters identify correspondingly throughout and wherein.

SUMMARY

A receiver may operate to AGC a multi-carrier signal through a corresponding number of inner loops and an outer loop AGC processes. The outer loop calibration and operating modes as set forth for determining the attenuation level allows the inner loops to effectively operate on each carrier of the multi-carrier signal with minimal quantization distortion for the desired portion of the received signal. A first number of bits for representing the multi-carrier signal with a limited amount of interference is determined through a calibration mode process. The first number of bits provides for quantization of the multi-carrier signal at an outer loop AGC to a maximum quantization level. After the received signal power estimate is reached a predetermined "ON" threshold, the outer loop AGC is operated at a second number of bits higher than the first number of bits to allow a quantization of possible interference in accordance with a difference of the first and second number of bits. The outer loop AGC switches back to use the first number of bits when the received signal power estimate falls below a predetermined "OFF" threshold. Moreover, the outer loop AGC may fix the attenuation level (inactive or "OFF" state) when using the first number of bits, and switches to an active or "ON" state when using the second number of bits. The ON and OFF thresholds may be at different levels to avoid hysterises of switching back and forth between using the first and second number of bits.

DETAILED DESCRIPTION OF THE PREFERRED EMBODIMENT(S)

Generally stated, various aspects of the invention provide for a receiver to operate for automatic gain control of a multi-carrier signal through corresponding multiple numbers of inner loops and an outer loop AGC process. The outer loop calibration and operating modes as set forth provide for operation over at least two different number of bits for quantization of the received signal which allows the inner loop to effectively operate on each carrier of the multi-carrier signal with minimal quantization distortion for the desired portion of the received signal while maximizing the amount of unwanted signal that an analog to digital converter (ADC) of the outer loop AGC may absorb. The absorbed unwanted signal may be rejected by each of the channel digital processing (DCP) blocks in the inner loop AGC. One or more exemplary embodiments described herein are set forth in the context of a digital wireless data communication system. While use within this context is advantageous, different embodiments of the invention may be incorporated in different environments or configurations. In general, the various systems described herein may be formed using software-controlled processors, integrated circuits, or discrete logic. The data, instructions, commands, information, signals, symbols, and chips that may be referenced throughout the application are advantageously represented by voltages, currents, electromagnetic waves, magnetic fields or particles, optical fields or particles, or a combination thereof. In addition, the blocks shown in each block diagram may represent hardware or method steps.

More specifically, various embodiments of the invention may be incorporated in a wireless communication system operating in accordance with a communication standard outlined and disclosed in various standards published by the Telecommunication Industry Association (TIA) and other standards organizations. Such standards include the TIA/EIA-95 standard, TIA/EIA-IS-2000 standard, IMT-2000 standard, UMTS and WCDMA standard, GSM standard, all incorporated by reference herein. A copy of the standards may be obtained by writing to TIA, Standards and Technology Department, 2500 Wilson Boulevard, Arlington, Va. 22201, United States of America. The standard generally identified as UMTS standard, incorporated by reference herein, may be obtained by contacting 3GPP Support Office, 650 Route des Lucioles-Sophia Antipolis, Valbonne-France.

Figure 1:
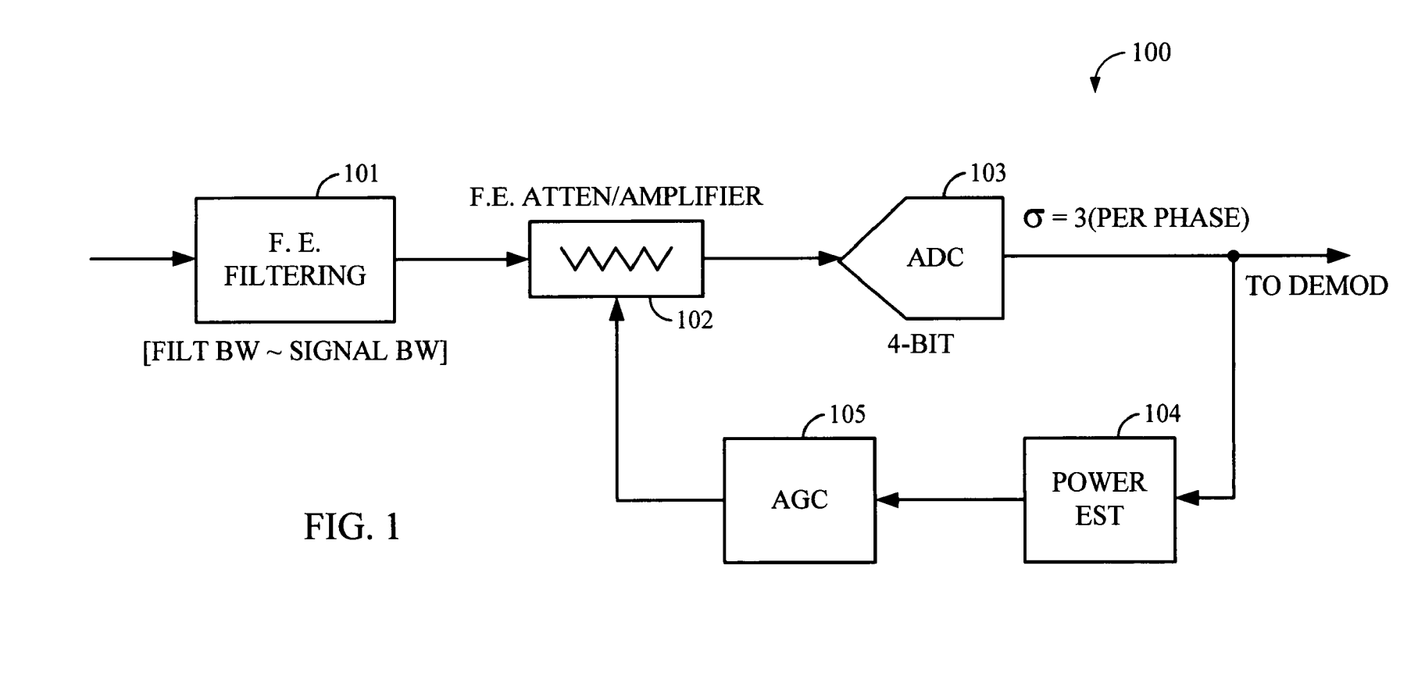
FIG. 1 depicts a receiver portion for processing a received signal.

FIG. 1 depicts a receiver portion 100 for receiving a signal, automatic gain controlling of the received signal, and converting the received signal from analog to digital for a demodulation process. A demodulator is not shown. A front-end filter 101 filters the received signal in accordance with an in-band frequency bandwidth. The in-band frequency bandwidth is selected such that the filter 101 passes through the signal carrying the information and filters all other unwanted signals. The filtered signal is passed to a front-end attenuator/amplifier 102 for attenuating or amplifying the received signal in accordance with an automatic gain control (AGC) signal produced by AGC 105. An analog to digital converter (ADC) 103 converts the resulting signal and passes the signal to a demodulator. A power estimator circuit 104 determines the signal strength at the output of ADC 103. The information is passed to the AGC 105. The AGC 105 compares the estimated signal strength to a threshold. If the signal strength is below the threshold, the AGC 105 instructs the attenuator/amplifier 102 to increase the amplification level or decrease the attenuation level of the received signal. If the signal strength is above the threshold, the AGC 105 instructs the attenuator/amplifier 102 to decrease the amplification level or increase the attenuation level of the received signal. The threshold is selected such that the input signal level at ADC 103 is maintained within the quantization limitation of the ADC 103. As such, a demodulator receiving the output of the ADC 103 operates on a signal that is to some degree free of unnecessary distortion.

Generally, the digital calculation of a signal power is based on a random process. If "x" denotes a sample of a signal, the "$E(x2)$" denotes the signal power. The signal power "$E(x2)$" normally equates Variance of "x", Var(x), plus square of the mean value of "x", "$E2(x)$", i.e. "$E(x2)=Var(x)+E2(x)$. When the mean value is near a zero value, the signal power is equal the variance of "x", i.e. $E(x2)=Var(x)$. A receiver front end may operate to remove the DC component of a signal to create a zero mean signal, for example according to a commonly known direct conversion process. In such a case, the mean value of the received signal is near the zero value. As such, by calculating the signal power, the Var(x) may be determined accordingly.

The standard deviation (Sigma) of the samples of the signal, at zero mean, is equal to the square root of the E(x2), i.e. square root of Var(x). To limit the processing distortion of the signal, the number of bits required to represent a signal is based on the standard deviation of the signal samples. The standard number of bits required for operation may be represented by log2(Sigma+1)+1. For a four bits ADC, the optimal Sigma may be equal to three to achieve a maximum signal-to-quantization noise ratio. Two bits may be used to actually represent the signal amplitude. One bit may be reserved for the sign of the sample and one bit for a back-off to prevent saturation of the ADC 103 input. The E(x2) of the signal may then have nine units in digital domain. For a four bits ADC, yielding a signal-to-quantization noise ratio of slightly below 20 dB, the optimum input signal level is approximately equal to 18 (9 per phase of the signal) for complex processing of the signal. The digital samples produced by the ADC 103 are digitally presented to a demodulator for proper demodulation process. The receiver portion 100 may also have down converter mixer and other blocks, but are not shown for clarity. Moreover, the filtering process may take place over several stages of filtering.

Figure 2:
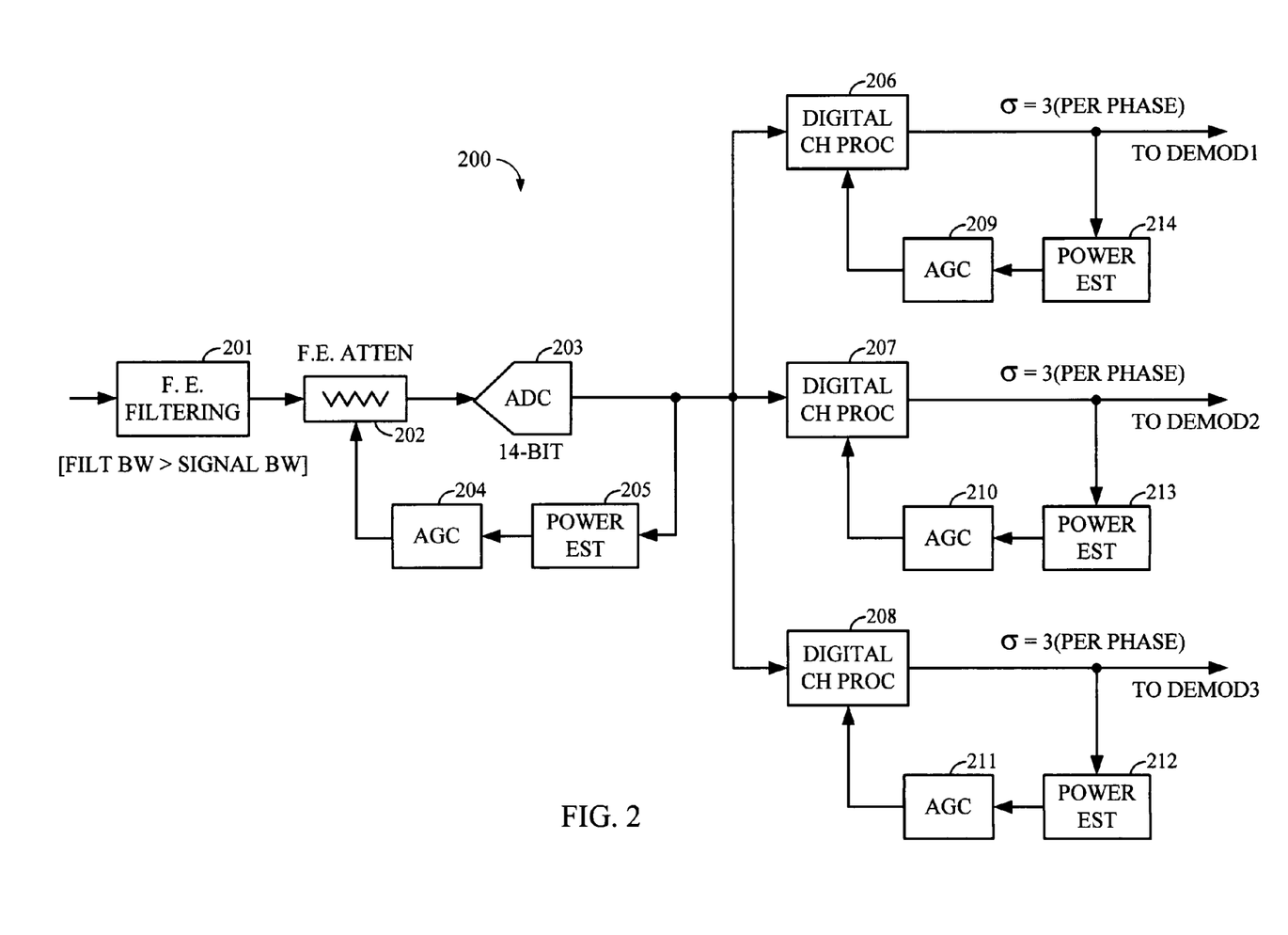
FIG. 2 depicts a receiver portion for processing a received multi-carrier signal capable of operating in accordance with various aspects of the invention.

A multi-carrier signal constitutes more than one adjacent or non-adjacent carrier frequency signals. After the front-end processing, the digital demodulation may be done on each carrier independently and with different demodulation resources. Referring to FIG. 2, a block diagram of a multi-carrier receiver portion 200 capable of operating in accordance with various aspects of the invention is shown. The operation of filter 201, attenuator/amplifier 202, ADC 203, power estimate 205 and AGC 204 are similar as corresponding blocks in FIG. 1. The bandwidth of the front-end filtering 201 may correspond to the bandwidth of several adjacent carriers (e.g. 3 adjacent cdma2000 carriers). If the same receiver is used for the processing of cdma2000 multi-carrier waveforms (up to 3 adjacent carriers) and for WCDMA, the bandwidth of the front-end filtering may be in the order of five MHz.

The Channel Digital Processing (CDP) blocks 206-208 process the ADC samples for each carrier of the received multi-carrier signal. For each carrier signal, an inner loop AGC operates to maintain the digital samples corresponding to a carrier at an acceptable quantization level to confine the signal level within the limitation of a demodulator used for demodulation of each carrier signal. For example, the inner loop AGC formed by CDP 206, power estimator 214 and AGC 209 operates to control the quantization of digital samples passed to a first demodulator. The first demodulator (not shown) operates to extract the information carried by the carrier signal corresponding to the signal selected by DCP 206 for processing. The second inner loop AGC formed by the DCP 207, power estimator 213 and AGC 210 operates to control the quantization of digital samples passed to a second demodulator. The second demodulator (not shown) extracts the information carried by the carrier signal corresponding to the signal selected by DCP 207 for processing. The third inner loop AGC formed by the DCP 208, power estimator 212 and AGC 211 operates to control the quantization of digital samples passed to a third demodulator. The third demodulator (not shown) extracts the information carried by the carrier signal corresponding to the signal selected by DCP 208 for processing. The processing within each DCP may include sampling rate down-conversion, accompanied by filtering that may enhance the frequency rejection for out-of-band unwanted signals for each of the carrier signals. Therefore, each DCP block conditions the signal for processing of the information for each of the carrier signals.

The wide front-end filtering makes it necessary to use ADC 203 with a large number of bits, for example 14 bits in comparison to 4 bits in a single carrier implementation shown in FIG. 1, to provide a large number of levels in digital representation of the received signal. As a result, the DCP 206-208 may operate on a large number of levels of received digital samples to allow proper filtering and digital processing. The inner loop AGC controls the signal power in the form of digital samples for each demodulator. For a 4-bit demodulator, the inner loop AGC may drive the power of the samples going to the demodulator to an average signal power level of 18 in complex domain, as it is done for the single carrier receiver shown in FIG. 1. Each wideband receiver, such as receiver portion 200, may have one outer loop AGC, and one inner AGC loop for each carrier of the multi-carrier signal. The gain that the inner loop AGC calculates via its AGC block is applied to the corresponding DCP block. The DCP block raises or decreases the signal gain accordingly. Each inner loop AGC may have a different gain level at different times with the same or different AGC thresholds. The inner loop AGC may have a time constant comparable to the time constant of the AGC loops of traditional receivers, such as one shown in FIG. 1. The time constant may be in the order of 100 microseconds. The time constant for each inner loop AGC may also be different. As such, the inner loops AGC may operate independent from each other. Proper operation of the joint outer/inner loops AGC may require the outer loop AGC to have a time constant several degrees of magnitude larger than that of the Inner loops AGC. A value of the order of 100 milliseconds would be reasonable for the outer loop AGC time constant, in an example.

The outer loop AGC controls the front end attenuation/amplification level that is needed to minimize the distortion of the interested portion of the signal, and yet maximize the amount of unwanted signal that ADC 203 may absorb, in accordance with various aspects of the invention. In nominal conditions when the level of unwanted signals (out of band signals) is negligible, the outer loop AGC controls the received multi carrier signal power level, including any added receiver noise, at the input of the ADC 203 such that a small number of bits are used to digitize the signal. The small number of bits may be comparable to the number of bits used for processing a single carrier signal. In such a condition, when the interference level is negligible, the number of bits used may be in the range of 4 to 6 bits. In such a condition (inactive state), the outer loop AGC is "open" and may not change the gain/attenuation of the signal and the receiver noise at the input of ADC 203. At other conditions (active state), when the level of interference is more than nominal, the ADC 203 uses a large number of bits to accommodate the digitization of the combination of the desired and undesired signals. It is important to note that the signal processing inherently includes processing any receiver noise. The rejection of the unwanted signals that pass through the front end filtering takes place at each of the inner loop DCP blocks through digital signal processing. A DCP block operates to remove all unwanted signals, as much as possible. At each of the inner loops AGC, the unwanted signals include the other carrier signals of the multi-carrier signal and other possible interferences. Each DCP processes signals of one of the carriers.

The following Table 1 summarizes the trade-off between the number of bits of the ADC kept for the processing of the desired signal (including any receiver generated noise) and the interference signal that can be absorbed by the ADC. The total allowed Sigma ("σ") includes a combination of Sigma accounted for the signal and the interference. Since the interference and the signal are considered independent processes, the total Sigma is based on a linear combination of Sigma square ("σ2") allocated to the signal and interference.

TABLE 1

Total allowed sigma for 13 bits is 4095

| Bits for signal/noise | Sigma for signal/noise | Sigma for Interference | Bits for Interference | Interference over Signal dB |
|---|---|---|---|---|
| 3 | 3 | 4095.00 | 13.00 | 62.70 |
| 4 | 7 | 4094.99 | 13.00 | 55.34 |
| 5 | 15 | 4094.97 | 13.00 | 48.72 |
| 6 | 31 | 4094.88 | 13.00 | 42.42 |
| 7 | 63 | 4094.52 | 13.00 | 36.26 |
| 8 | 127 | 4093.03 | 13.00 | 30.16 |
| 9 | 255 | 4087.05 | 13.00 | 24.10 |
| 10 | 511 | 4062.99 | 12.99 | 18.01 |
| 11 | 1023 | 3965.16 | 12.95 | 11.77 |
| 12 | 2047 | 3546.66 | 12.79 | 4.77 |
| 13 | 4095 | 0.00 | 1.00 | −∞ |

From the Table 1, the importance of the number of bits left as room for representing the unwanted signal before saturating the front-end receiver is evident. The signal-to-quantization noise of the desired signal may decrease with a smaller number of bits allocated to represent it. However, the ADC may get in return additional room for accommodation of the unwanted signals within the ADC. Filtering through the DCP of the inner loops may reject the out-of-band unwanted signals that went through the ADC 203.

The outer loop AGC 203 allows the incoming signal/noise ratio to be at a number of bits (e.g. 6-bits) as to guarantee a good signal-to-quantization ratio in the absence of unwanted signals. Since the front end gain/attenuation is fixed in this condition, this small number of bits to represent the signal/noise is maintained even in the presence of unwanted signals as long as the power of unwanted signals is within the range shown in the Table 1, in an example. Therefore, the same signal-to-quantization ratio may be kept even when the unwanted signals are present. The inner loops DCP most likely reject the unwanted signals prior to demodulation process for each carrier of the multi-carrier signal. When the power of the unwanted signal is larger than the range shown in the Table 1, the ADC 203 switches to using a large number of bits and the outer loop AGC may control the front-end gain/attenuation of the incoming signal, including the desired and undesired signals, to close to the full ADC range (e.g. 14-bits). The outer loop AGC effectively moves "upwards" in the Table 1 (e.g. from 6-bits allocated for signal/noise to 3 or 4 bits). The maximum attenuation may be fixed to allow to the outer loop AGC maintain at least 3-bits for the signal/noise representation. More attenuation beyond such a fixed level, probably, attenuates the signal of interest.

Generally speaking, a method and apparatus provides for a communication system receiver for processing a multi-carrier signal. A first number of bits are determined for representing the multi-carrier signal with a limited amount of interference. The first number of bits allows quantization of the multi-carrier signal at an outer loop AGC for receive processing to a maximum quantization level provided by the determined first number of bits. The outer loop AGC gain/attenuation is fixed, in an inactive state, to a predetermined level when the first number of bits are used for quantization of the received signal. The outer loop AGC is operated, in an active state, at a second number of bits higher than the first number of bits after detecting the power estimate of the received signal has reached an "ON" threshold. In this condition, the quantization of the received signal and possible interference is in accordance with the second number of bits, and the outer loop AGC is turned "ON" to operate to control the signal level. The inner loop channel DCP provides the digital signal processing for rejecting undesired signal passed through the front end filtering. At the outer loop, after the multi-carrier signal with interference has reached an "OFF" threshold, the outer loop AGC operates at the first number of bits, and turned "OFF" to operate at a fixed gain/attenuation level, in the inactive state.

One or more algorithms may be employed for calibration mode and regular operation mode of the receiver portion 200. The calibration mode may be required for proper determination of the fixed value of the front-end gain/attenuation of the block 203, when the first number of bits are used for the quantization process. The fixed value is used for the inactive state of the outer loop AGC during a regular operational mode. The calibration mode may be performed when manufacturing or installing the receiver portion, and in the case of parts replacement.

The calibration mode may require that the receiver input, the input of filter 201, be terminated to prevent picking up of any unnecessary signal. In such a case, the ADC 203 may be digitizing just over the receiver thermal noise. A purpose of this operation mode is to set the front-end attenuation to a value such that the signal power (thermal noise) at the input of the ADC corresponds to a particular desired value. In other words, the ADC is using a determined number of bits to digitize the thermal noise. The same number of bits may be used when the multi carrier signal is present during the operation mode because a CDMA signal, by nature, is below the noise level. Since a 14-bit ADC may be used, the AGC leveling may be set to 4-6 bits achieving a very high signal-to-quantization ratio. The following Table 2 summarizes the standard deviation targeted by the AGC to represent the signal with different number of bits.

TABLE 2

Number of bits-to-target standard deviation Mapping

| #bits | $\sigma_{setpoint}$ |
|---|---|
| 3 | 3 |
| 4 | 7 |
| 5 | 15 |
| 6 | 31 |

Regular operation of CDMA reverse links may result in a rise over thermal (ROT) not higher than 3-4 dB. Therefore, calibrating the receiver, with a terminated input, to AGC to 4-6 bits and having a 14-bit ADC may enable proper digitization of the incoming signal over all the nominal ranges. For the calibration mode, the AGC block may converge to the front-end gain/attenuation that attains the desired standard deviation at the output of the ADC (for example $\sigma_{setpoint}=31$ if ADC is set for 6-bits). The value of the converged gain/attenuation level is used as the fixed value of the outer loop AGC inactive operation.

Figure 3:
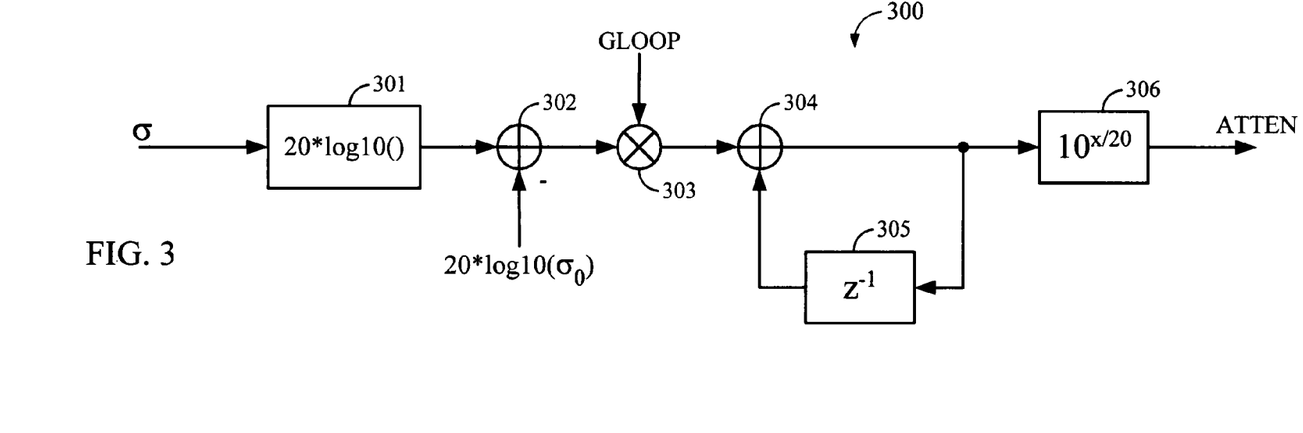
FIG. 3 depicts an automatic gain control operational block diagram for controlling the gain of an inner or outer loop of a receiver for receiving a multi-carrier signal.

FIG. 3 depicts operational block diagram 300 of the AGC block 204 for calibration. The value of σsetpoint at the input of block 301 depends on the number of bits that is used to digitize the thermal noise level. Table 2 provides some examples of values that may be used. The "Gloop" parameter input is the loop gain for this first order loop and its value depends on the time constant that is desired to be achieved. Finally, to get the amplitude attenuation value at the output of the AGC block 204, a conversion from "dB" domain to linear domain may be needed. This attenuation level may have to be appropriately quantized prior to its application. For example, for a resolution of 0.5 dB, the sum-accumulate outputs are quantized to 0.5 dB resolutions.

Whenever a calibration is performed, the loop is allowed to converge by waiting a multiple number of time-constants (5 time constants would be sufficient). The average values of "Atten" and "σ" may be obtained over several runs. The averaging is not time-critical and therefore may be performed in software to avoid additional computations in the firmware. Depending on the granularity of the Attenuation value, the value of σ may be closer or further away from the target value σsetpoint.

The obtained average attenuation value may become the nominal attenuation for the outer loop AGC when the small number of bits are used for the quantization. The value is used for the fixed attenuation value (Atten0) used in the outer loop regular operation mode. At the same time, similar operation may be performed for the inner loops to store the average value of the inner loop AGCs gain values as part of the calibration process. The use of the inner loop AGCs gain values may become clear in other parts described.

The regular operation mode may be more understood from the following state diagram showing the state machine of this operation mode:

During the Inactive State, the Outer Loop AGC is open and hence the front-end Attenuation is fixed to the value obtained during calibration (Atten0). The receiver, however, keeps monitoring the total power at the output of the ADC 203. Whenever the measured σ is above certain threshold (Thr0), a change of state is triggered, and the process moves from Inactive State to Active State. It is preferable to be or move to the Active State whenever the receiver is receiving more than appreciable level of unwanted signal. Once in the Active State, the outer loop AGC may close and allow the AGC process to provide a certain number of bits at the input/output of the ADC. To fully exploit the ADC dynamic range, the outer loop AGC may attempt to AGC to 13-bits (one less than the full range of the ADC). In the Active State, there may be a couple of options. The first option is to set a maximum front-end Attenuation level so that a minimum number of bits are allocated to represent the signal/noise input at the ADC input. The second option is not setting any constraint on the maximum front-end attenuation. By not setting any constraint on the maximum front-end attenuation, the signal of interest may be removed from the ADC produced signal. Effectively, the first option preserves a minimum number of bits allocated to the signal of interest at the expense of not closing the loop to the Active State set point and hence allowing some additional saturation. If the unwanted signal power is so large that severely saturates the ADC for the maximum attenuation allowed, the recovery of the signal of interest may become also impossible. However, if the attenuation is not too severe, the signal may be recoverable.

When the measured σ referenced to the front-end input (prior to the front-end attenuation) i.e. (σ×Atten) is below certain threshold, denoted as (Thr1×Atten0), the process may go back to the Inactive State of the algorithm knowing that the ADC is able to digitize the incoming signal with the default front-end attenuation Atten0. In the Inactive State, the algorithm may open the loop and restore the default front-end attenuation (Atten0). In general, to add some hysteresis to the triggering from Active State to Inactive State and vice-versa, the Thr1 may be set at a smaller value than Thr0. The "Thr1" may be referred to as "OFF" threshold, and "Thr0" as "ON" threshold.

Figure 4:
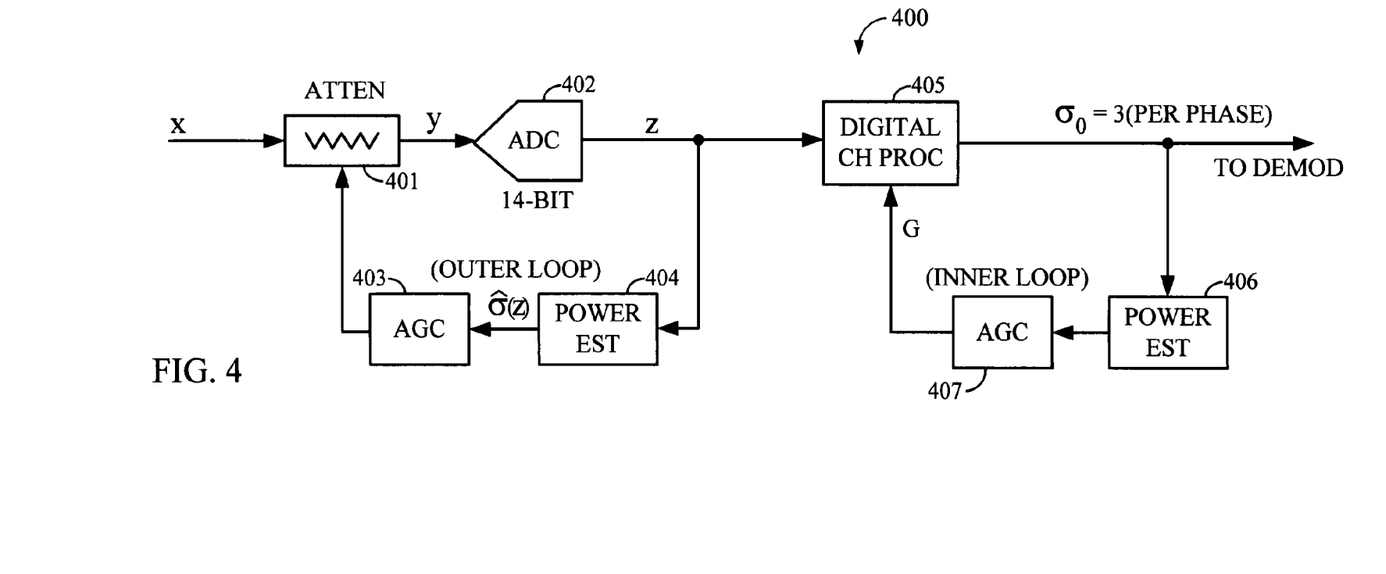
FIG. 4 depicts an outer loop and inner loop of a receiver portion for receiving a multi-carrier signal.

FIG. 4 shows again an operational block diagram 400 of a receiver portion (for one of the carriers of a multi-carrier signal) in connection with the description for determination of rise over thermal (ROT). The gain through the DCP 405 is composed of a fixed part and a variable part. The fixed part contributes equally to the magnitude of the level of a rise over the thermal noise and the level of the thermal noise, and, therefore, may not contribute to ROT estimation. The variable part consists of the inner loop AGC gain (G) formed by the blocks 405-407. Neglecting the standard deviation compression through the ADC 402, the only variable left is the front-end Attenuation of block 401. Therefore, the ROT may written as:

$$R\hat{O}T(\text{dB}) = 20*\log10\left(\frac{\frac{\sigma_0}{G} \times Atten}{\frac{\sigma_0}{G_0} \times Atten0}\right) = 20*\log10\left(\frac{G_0 \times Atten}{G \times Atten0}\right)$$

Where:
  Atten0 is the nominal attenuation obtained from Calibration.
  $G_0$ is the Inner AGC loop gain that was also stored during Calibration.
  Atten is the currently used value of the front-end attenuator.
  G is the average currently used gain used in the Inner AGC loop.
  σ0 is the standard deviation targeted by the inner loop AGC for the calibration mode and regular operation mode.

The Received Signal Strength (RSSI) may be estimated easily by offsetting the ROT value by a value equivalent to the noise floor of the receiver front end. The receiver noise floor may be determined during manufacturing of the receiver or predetermined to a known value based on various design criteria. As such, a receiver may operate to AGC a multi-carrier signal through an inner loop and an outer loop AGC process. The outer loop calibration and operating modes as set forth for determining the attenuation level allows the inner loop to effectively operate on each carrier of the multi-carrier signal with minimal quantization distortion for the desired portion of the received signal.

Furthermore, improving demodulation performance at low geometries with few adjacent cell may be improved Definitions. The term "PilotDrop" means the value used by a subscriber station or access terminal to start a pilot drop timer for a pilot in the Active Set or the Candidate Set. The value of the PilotDrop may be conveyed by the network to the subscriber station. Conceptually the value of PilotDrop sets a threshold of the signal strength below which the pilot should no longer be used for demodulation. The term "PilotDropTimer" means a timer value after which an action is taken by the access terminal for a pilot that is a member of the Active Set or Candidate Set, and whose strength has not become greater than the value specified by the PilotDrop. If the pilot is a member of the Active Set, a RouteUpdate, or similar message, may be sent in the connected state. If the pilot is a member of the Candidate Set, it may be moved to the Neighbor Set. The term "Active Set" means a set of pilots (specified by the pilot's PN offset and the pilot's CDMA channel) associated with the sectors currently serving the access terminal. When a connection is open, a sector is considered to be serving an access terminal when there is a Forward Traffic Channel, Reverse Traffic Channel and Reverse Power Control Channel assigned to the access terminal. When a connection is not open, a sector is considered to be serving the access terminal when the access terminal is monitoring that sector's control channel. The term "Candidate Set" means a set of pilots (specified by the pilot's PN offset and the pilot's CDMA channel) that are not in the Active Set, but are received by the access terminal with sufficient strength to indicate that the sectors transmitting them are good candidates for inclusion in the Active Set. A demodulator may include a RAKE receiver with a rake of fingers. The fingers may be considered as the main resource in the demodulator and they are limited. Each finger may be used to track and demodulate one single path of the incoming signal. Therefore, by having multiple fingers, path diversity may be exploited. Optimal performance may be achieved by efficiently allocating the limited amount of resources, i.e., fingers, in the demodulator. The concepts of "finger lock" and "lock thresholds" may be used to achieve this objective. The demodulator may be used to continuously monitor the strength of the pilots tracked by each of its fingers. From this monitoring, the demodulator can label each of the fingers as "in-lock" or "out-of-lock". This label is denoted as the "finger lock status". FIG. 1 shows an example of the finger lock status as a function of the pilot signal strength. For this particular example, hysteresis exists in the transition of status. In one embodiment of the demodulator, there may be an algorithm that de-allocates fingers that have been out-of-lock for certain amount of time. The network may use the PilotDrop value to convey to the subscriber station when a pilot should be discarded for demodulation purposes. In fact, whenever the signal strength of a pilot goes below the PilotDrop threshold for a time duration longer than PilotDropTimer, the subscriber station may discard that pilot for demodulation and therefore will have one finger vacant. The network operator may try to optimize the value of the PilotDrop for its own network as it may depend on the network topology, number of adjacent cells, etc. In one embodiment of the demodulator, a link between the finger lock thresholds and the PilotDrop threshold may exist to optimize performance. In the past, the finger lock thresholds have been fixed modem parameters. These thresholds were typically set in the modem. One can easily envision several situations where the network could be conveying a low value of the PilotDrop. That would mean that the network is expecting to have few pilots visible to the mobile. For example, for a very large rural or suburban cell with few neighbor cells, the subscriber station will mostly see just one strong pilot without much path diversity. Therefore, most of the time the demodulator will not be finger limited. Indeed, the demodulator could afford tracking virtually any pilot that it sees no matter how weak they are. At the edge of the cell, it is possible that the available pilots are so weak that nominal finger lock thresholds would not even let the demodulator track and demodulate them. Therefore, in one embodiment of the demodulator, the PilotDrop may be linked to the values of the finger lock thresholds. The link may be almost anything depending on the specific application, the overall design parameters, or any other factors considered relevant by those skilled in the art. The link may be range-dependent, in other words, for typical values of the PilotDrop, the finger lock thresholds may be left to their default values. However, if an unexpected low PilotDrop value is conveyed by the network, that may trigger a change in the finger lock thresholds at the terminal. The change of the finger lock thresholds at the terminal may extend the range at which the fingers are kept in-lock, and therefore, may allow demodulation of weak pilots. Alternatively, the link between the PilotDrop and the finger lock thresholds may be linear. In some cases, more complex mapping schemes between the two may be used. There may be a difference between the lower and the upper finger lock thresholds due to hysteresis. The demodulator may be configured keep the same ratio between the lower and upper thresholds, or the ratio may be changed. Since hysteresis is built into the finger lock thresholds, to go back to the finger "in-lock" state may require a long duration of time, during which the frames or packet transmitted to the subscriber station may be lost. By changing the default finger lock thresholds to lower than usual values, the demodulator may keep its fingers on the paths for weaker signals, thereby improving demodulation performance. In addition, the response time of the demodulator to demodulate data as soon as the channel conditions recover may improve.

Those of skill in the art would further appreciate that the various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present invention.

The various illustrative logical blocks, modules, and circuits described in connection with the embodiments disclosed herein may be implemented or performed with a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The steps of a method or algorithm described in connection with the embodiments disclosed herein may be embodied directly in hardware, in a software module executed by a processor, or in a combination. A software module may reside in RAM memory, flash memory, ROM memory, EPROM memory, EEPROM memory, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

The previous description of the preferred embodiments is provided to enable any person skilled in the art to make or use the present invention. The various modifications to these embodiments will be readily apparent to those skilled in the art, and the generic principles defined herein may be applied to other embodiments without the use of the inventive faculty. Thus, the present invention is not intended to be limited to the embodiments shown herein but is to be accorded the widest scope consistent with the principles and novel features disclosed herein.

What is claimed is:

1. A method for a communication system receiver for processing a multi-carrier signal, comprising:
    determining a first number of bits for quantization of said multi-carrier signal at an outer loop automatic gain control for said processing, wherein the first number of bits for quantization in an inactive state of a regular operation mode is determined during a calibration mode of the receiver;
    operating said outer loop automatic gain control at said first number of bits in the inactive state of the regular operation mode by fixing an attenuation level of said outer loop to a default value and at a second number of bits in an active state of the regular operation mode when a power estimate of said multi-carrier signal reaches an ON threshold;
    operating said outer loop automatic gain control to switch from said second number of bits in said active state to said first number of bits in said inactive state by fixing the attenuation level of said outer loop to the default value when said power estimate of said received signal reaches an OFF threshold;
    wherein the second number of bits is greater than the first number of bits in order to quantize a combination of the multi-carrier signal and an undesired signal; and
    performing inner loop digital signal processing for rejecting the undesired signal passed through outer loop signal processing including said outer loop automatic gain control.

2. An apparatus for a communication system receiver for processing a multi-carrier signal, comprising:
    an outer loop automatic gain control configured for operating at a first number of bits in an inactive state of a regular operation mode by fixing an attenuation level of said outer loop to a default value, at a second number of bits different from the first number of bits for a duration of an active state of the regular operation mode when a power estimate of said multi-carrier signal reaches an ON threshold, and to switch from said second number of bits in said active state to said first number of bits in said inactive state by fixing the attenuation level of said outer loop to the default value when said power estimate of said received signal reaches an OFF threshold, wherein the first number of bits for quantization in the inactive state of the regular operation mode is determined during a calibration mode of the communication system receiver;
    wherein the second number of bits is greater than the first number of bits in order to quantize a combination of the multi-carrier signal and an undesired signal; and
    an inner loop digital signal processor for rejecting the undesired signal passed through outer loop signal processing including said outer loop automatic gain control.

3. A method for a communication system, comprising:
    controlling gain of a multi carrier signal in accordance with operation of an outer loop automatic gain control quantizing said multi carrier signal at a first number of bits in an inactive state of a regular operation mode by fixing an attenuation level of said outer loop to a default value, at a second number of bits different from the first number of bits for a duration of an active state of the regular operation mode when a power estimate of said multi-carrier signal reaches an ON threshold, and switching from said second number of bits in said active state to said first number of bits in said inactive state by fixing the attenuation level of said outer loop to the default value when said power estimate of said multi-carrier signal reaches an OFF threshold, wherein the first number of bits for quantization in the inactive state of the regular operation mode is determined during a calibration mode of a receiver;

wherein the second number of bits is greater than the first number of bits in order to quantize a combination of the multi-carrier signal and an undesired signal; and rejecting, via an inner loop digital signal processing, the undesired signal passed through outer loop signal processing including said outer loop automatic gain control.

4. An apparatus for processing a multi carrier signal, comprising:

an outer loop automatic gain control for controlling gain of said multi carrier signal, including means for quantizing said multi carrier signal at a first number of bits in an inactive state of a regular operation mode by fixing an attenuation level of said outer loop to a default value and at a second number of bits different from the first number of bits for a duration of an active state of the regular operation mode when a power estimate of said multi-carrier signal reaches an ON threshold and means for switching from said second number of bits in said active state to said first number of bits in said inactive state by fixing the attenuation level of said outer loop to the default value when said power estimate of said received signal reaches an OFF threshold, wherein the first number of bits for quantization in the inactive state of the regular operation mode is determined during a calibration mode of a receiver;

wherein the second number of bits is greater than the first number of bits in order to quantize a combination of the multi-carrier signal and an undesired signal; and an inner loop digital signal processor for rejecting the undesired signal passed through outer loop signal processing including said outer loop automatic gain control of each carrier of said multi carrier signal.

5. A computer-program product for processing a multi-carrier signal, the computer-program product comprising a non-transitory computer readable medium having instructions thereon, the instructions comprising:

code for controlling gain of a multi carrier signal in accordance with operation of an outer loop automatic gain control quantizing said multi carrier signal at a first number of bits in an inactive state of a regular operation mode by fixing an attenuation level of said outer loop to a default value, at a second number of bits different from the first number of bits for a duration of an active state of the regular operation mode when a power estimate of said multi-carrier signal reaches an ON threshold, and switching from said second number of bits in said active state to said first number of bits in said inactive state by fixing the attenuation level of said outer loop to the default value when said power estimate of said multi-carrier signal reaches an OFF threshold, wherein the first number of bits for quantization in the inactive state of the regular operation mode is determined during a calibration mode of a receiver;

wherein the second number of bits is greater than the first number of bits in order to quantize a combination of the multi-carrier signal and an undesired signal; and code for rejecting, via an inner loop digital signal processing, the undesired signal passed through outer loop signal processing including said outer loop automatic gain control.

* * * * *